United States Patent [19]  [11] 3,997,772
Crochiere et al.  [45] Dec. 14, 1976

[54] DIGITAL PHASE SHIFTER

[75] Inventors: Ronald Eldon Crochiere, Chatham; Lawrence Richard Rabiner, Berkeley Heights; Richard Robert Shively, Convent Station, all of N.J.

[73] Assignee: Bell Telephone Laboratories, Incorporated, Murray Hill, N.J.

[22] Filed: Sept. 5, 1975

[21] Appl. No.: 610,540

[52] U.S. Cl. .................................. 235/152; 328/155
[51] Int. Cl.² ............................................. G06F 1/00
[58] Field of Search ............ 235/152, 156; 328/155

[56] References Cited

UNITED STATES PATENTS

| | | | |
|---|---|---|---|
| 3,755,748 | 8/1973 | Carlow et al. | 328/155 |
| 3,825,737 | 7/1974 | Croisier | 235/152 X |
| 3,833,854 | 9/1974 | Schonover | 328/155 |
| 3,835,397 | 9/1974 | D'Antonio | 328/155 |
| 3,908,896 | 9/1975 | Monrolin | 235/152 |

Primary Examiner—David H. Malzahn
Attorney, Agent, or Firm—A. E. Hirsch, Jr.; Robert O. Nimtz

[57] ABSTRACT

In many digital processing systems it is necessary to delay an applied signal by a time interval which is not an integer multiple of the system sampling period. Disclosed herein is a digital phase shifter which utilizes a particular digital filtering scheme for supplying virtually any predetermined delay. Although conceptually related to the digital concepts of phase shift by interpolation and decimation in which the sampling rate is first increased and then restored to the original sampling rate after effecting the desired phase shift, the disclosed phase shifter operates entirely at the system sampling rate. This is accomplished by establishing a specific predetermined subset of digital filter coefficients and combining the coefficients with the input signal samples in a multiplier and accumulator circuit.

11 Claims, 2 Drawing Figures ized in a circuit operating at the sampling rate of the applied signal. Structurally, our invention is similar to the direct realization of a finite impulse response (FIR) digital filter

DIGITAL PHASE SHIFTER

BACKGROUND OF THE INVENTION

This invention relates to digital phase shift circuits. More particularly, this invention relates to a digital phase shifter, incorporating the concepts of interpolation and decimation, which can supply a delay or linear phase shift that is a non-integer multiple of the sampling period of the applied signal.

Linear phase shift or delay of a signal waveform is often necessary in digital signal processing systems. In applications where the desired delay is an integer multiple of the system sampling period, prior art digital phase shifters have generally comprised cascade arrangements of unit delay networks. In applications such as the interfacing of a digital processing system with an analog system, it is often necessary to provide delays which are non-integer multiples of the digital sampling rate. For example, in the cancellation of echoes, digital systems are often used to generate artificial echoes by means of simulation of an echo. These artificial echoes are then subtracted from the original analog signal to effect echo cancellation. To provide the most satisfactory result, the simulated digital echo may have to be delayed by a non-integer multiple of the sampling period. A second instance in which a non-integer delay is required occurs when a plurality of signals must be processed simultaneously, such as in a phased array antenna system.

Recently, the concepts of decimation and interpolation as taught by R. W. Schafer and L. R. Rabiner in "A Digital Signal Processing Approach to Interpolation," Proceedings of the IEEE, Vol. 6, No. 6, pages )-707, June, 1973, have provided digital signal processing techniques applicable to realizing a digital phase shifter which is capable of non-integer delay. Interpolation and decimation are terms which respectively describe $x(n)$, rate increase and decrease -1), . . ., integer factors. In a digital phase shifter utilizing interpolation and decimation, the sampling rate is increased by a factor D by adding D-1 zero-valued samples between adjacent samples of the original signal. The resulting signal is then filtered by a low-pass filter to remove the periodic frequency components which are centered about integer multiples of the original sampling frequency. The interpolated signal is then delayed an integer number of samples, $p$, at the higher sampling rate and the signal is then restored to the original sampling rate by a decimation circuit which effectively selects every Dth sample of the delayed interpolated signal to provide a non-integer delay of $p/D$ T where T is the sampling period of the original signal, D is the decimation and interpolation factor, and $p$ is the integer delay at the higher sampling rate. Although such a system is generally satisfactory, the use of two different sampling rates results in a fairly complex structure.

Accordingly, it is an object of this invention to realize a digital phase shifter which operates at the same sampling rate as the system in which it is employed and is capable of providing non-integer delay.

SUMMARY OF THE INVENTION

In accordance with our invention, phase shift or delay of a sampled data signal is achieved in a circuit operating at the sampling rate of the applied signal. Structurally, our invention is similar to the direct realization of a finite impulse response (FIR) digital filter having a predetermined filter length which is dependent on the parameters which describe the desired phase shift of delay in an equivalent interpolator-decimator phase shifter. The filter coefficients comprise a predetermined subset of quantities in which each coefficient is also a function of the interpolator-decimator delay parameters. The coefficients and an appropriate set of samples of the input signal are multiplied together and accumulated to supply each sample of the phase-shifted output signal. In one embodiment, a variable phase shifter is realized by storing a plurality of coefficient subsets and selecting the subset which corresponds to the particular delay to be generated.

DETAILED DESCRIPTION

Figure 1:
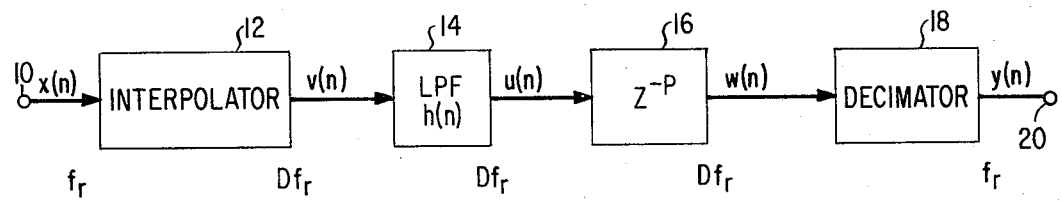
FIG. 1 is a block diagram illustrating an interpolator-decimator phase shifter which is helpful in understanding the principles of this invention.

FIG. 1 illustrates an interpolator-decimator phase shifter which is of assistance in understanding the present invention. In order to implement a delay of $p/D$ samples, where $p$ and D are any integers, input signal $x(n)$ having a sampling rate, $f_r$, is applied to input terminal 10 and the sampling rate is first increased by an integer factor D by interpolator circuit 12 which inserts D-1 zero-valued samples between each pair of samples in $x(n)$. The resulting signal $v(n)$, which has a sampling rate $Df_r$, is then filtered by low-pass filter 14. Because of its linear phase characteristic and stability, a finite impulse response (FIR) filter is generally employed as filter 14. In any case, filter 14 removes periodic frequency components which are centered about integer multiples of the original sampling frequency. The output of filter 14, denoted as $u(n)$ in FIG. 1, is an interpolated version of the input signal $x(n)$. The signal $u(n)$ is then delayed by $p$ samples at the high sampling rate by delay unit 16, which can be any conventional digital delay circuit. Where the delay $p$ produced by delay unit 16 is an integer, $0 \le p \le$ D-1, the resulting signal is simply a delayed version of $u(n)$ commonly expressed as $w(n) = u(n-p)$.

Decimator 18 restores the signal to the original sampling rate by effectively choosing every Dth sample of $w(n)$. The net effect is to delay the original signal $x(n)$ by a non-integer delay of $p/D$ T, where $T = 1/f_r$ is the sampling period at lower or system sampling rate. As will be seen, low-pass filter 14 generally introduces an additional fixed integer delay.

The operation of the digital phase shifter of FIG. 1 can be understood by examining the signal relationships. The output of interpolator 12 can be expressed as $$V(e^{j\omega}) = X(e^{j\omega D}) \tag{1}$$

and the output of delay unit 16 can be expressed as $$W(e^{j\omega}) = H(e^{j\omega}) e^{-j\omega p} V(e^{j\omega}) \tag{2}$$

where $X(e^{j\omega})$, $V(e^{j\omega})$, $W(e^{j\omega})$, and $H(e^{j\omega})$ are the Fourier transforms of $x(n)$, $v(n)$, $w(n)$, and the filter response $h(n)$, respectively. The output signal which is coupled to output terminal 20 can be shown to be approximately $$Y(e^{j\omega}) \approx 1/D \; W(e^{j\omega/D}) \qquad (3)$$

Utilizing Equations (1) and (2), it can be shown that Equation (3) can be expressed as $$Y(e^{j\omega}) \approx 1/D \; H(e^{j\omega/D}) e^{-j\omega p/D} X(e^{j\omega}) \qquad (4)$$

which can be recognized to represent the sum of two phase shifts.

For true delay filter 14 must exhibit exactly linear phase. For a filter 14 having a unit sample response duration of N samples and symmetric coefficients (i.e., $h(i) = h(N-1-i)$), its delay will be $(N-1)/2$ samples at the high sampling rate. If it is desired that this delay be an integer delay at the lower or system sampling rate, then N can be chosen such that $(N-1)/2$ is an integer multiple of D, that is, $/(N-1)/2 = ID$, where I is a positive integer. Under such conditions, it can be seen that the length or duration of the filter response of FIR filter 14 is $N = 2ID + 1$. If, additionally, the gain of filter 14 is D, it can be shown that the ratio of the output signal to input signal can be expressed as $$\frac{Y(e^{j\omega})}{X(e^{j\omega})} \approx e^{-j\omega I} e^{-j\omega p/D} \qquad (5)$$

or, in terms of z-transforms:

$$\frac{Y(z)}{X(z)} = z^{-I} z^{-p/D}$$

Thus, it can be recognized that the structure of FIG. 1 is essentially an all-pass filter network with a fixed integer delay of I samples due to the processing delay of low-pass filter 14 and a variable or selectable non-integer delay of $p/D$ samples. Of course, if the filter length N is not established equal to $2ID + 1$, the delay due to filter 14 will not be an integer. In any case, the output $y(n)$ of the circuit in FIG. 1 is an approximation to $x(n-p/D-I)$.

Since the duration of the filter function of filter 14 is N samples and D-1 of every D samples of $v(n)$ are zero valued, the filter $h(n)$ spans approximately N/D non-zero samples of $v(n)$. More precisely, in the case in which $N = 2ID + 1$, $h(n)$ spans $2I+1$ non-zero samples of $v(n)$ for the computation of some output points and 2I non-zero samples of $v(n)$ for the computation of other output points.

The difficulty in mathematically dealing with the variation in the number of samples can be eliminated by defining a new hypotheticae filter $h'(n)$, whose length $N'$ is $N'$ equals $(2I+1)D$, where $h'(n)$ describes a filter function defined by extending $h(n)$ with zero-valued coefficients $h(N), h(N+1), 1), h(N+2),... h(N'-1)$. It can be observed that the hypotheticae filter $h'(n)$ has exactly the same frequency response and delay as $h(n)$ but spans exactly $Q = 2I+1$ non-zero samples of $v(n)$.

Because the hypothetical filter spans exactly Q non-zero samples of $v(n)$, its output signal $y(n)$ may be shown to equal.

$$y(n) = \sum_{k=0}^{Q-1} h'(kD + (-p) \oplus D) \; x(n-k) \qquad (6)$$

where the symbol $\oplus$ corresponds to modulo operation. For example, if $p=2$ and $D=9$, $-2$ modulo 9 equals $+7$. Defining a subset of coefficients $$g_p(k) = h'(kD + (-p) \oplus D) \qquad (7)$$

where $k = 0, 1, ..., Q-1$. Equation (6) becomes $$y(n) = \sum_{k=0}^{Q-1} g_p(k) \; x(n-k)$$

which can be seen to be of the form of a Q-point convolution of $x(n)$ with $g_p(n)$, where $g_p(n)$ is a predetermined appropriate subset of the coefficients of $h'(n)$. Thus, to obtain a zero incremental phase shift, the Q input samples are multiplied with the set of coefficients $\{g_0(0) = h'(0), g_0(1) = h'(D),..., g_0(Q-1) = h'((Q-1)D)\}$. In a like manner, to obtain a delay of $p/D$ sampling periods, the Q input samples are multiplied with the coefficients $\{g_p(0) = h'((-p) \oplus D), g_p(1) = h'(D + (-p) \oplus D),...g_p(Q-1) = h'((Q-1)D + (-p) \oplus D)\}$.

Figure 2:
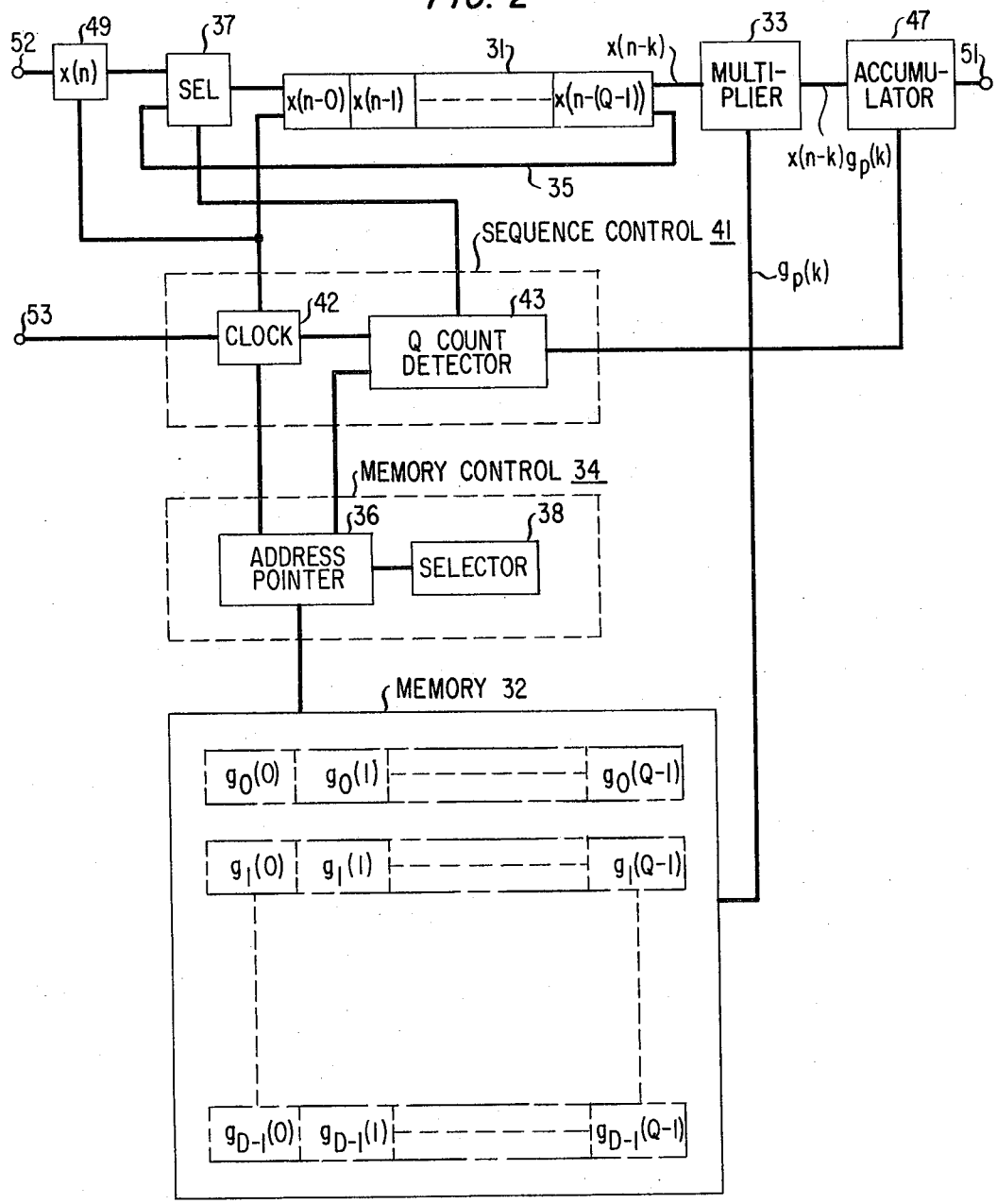
FIG. 2 depicts an embodiment of a digital phase shifter in accordance with this invention.

FIG. 2 depicts an embodiment of our invention which incorporates the above principles. In FIG. 2, the most-recent signal sample $x(n)$ is stored in a buffer memory 49 and the previous Q-1 input samples are stored in shift register 31 with the appropriate set of coefficients $g_p(n)$ stored in memory unit 32. As shown in FIG. 2, memory unit 32 may contain each of the possible D subsets of coefficients, in which case the phase shifter circuit will include means for selecting the desired coefficient subset. Such a configuration is capable of producing a selectable phase shift. Alternatively, any number of coefficient subsets between 0 and D-1 may be stored in memory unit 32 for applications in which either a single predetermined phase shift or a smaller number of selectable phase shifts is required.

In any case, the output of shift register 31 and the output of memory unit 32 are connected to the input terminals of multiplier circuit 33 which may be any conventional digital multiplier capable of handling the digital format used in a particular embodiment. Memory control unit 34 includes phase selector 38 and address pointer 36. Phase selector 38 is necessary only in embodiments which include selectable phase shift and selects the coefficient subset necessary to effect the selected phase shift. For example, in the embodiment of FIG. 2 when a zero incremental phase shift is selected, phase selector 38 directs address pointer 36 to the block of storage locations containing the coefficient subset $g_0(0), g_0(1),..., g_0(Q-1)$. Phase selector 38 may be one of any number of selector devices ranging from a simple manually operated selector switch to electronic circuitry which is responsive to any desired input stimuli. In each case, the configuration of phase selector 38 depends primarily on the configuration of memory unit 32 and the manner in which the desired phase shift is to be selected. For example, if memory unit 32 is a read-only memory (ROM) and the desired phase shift is to be selected by an electronic or manually operated switch, phase selector 38 advantageously assumes the form of a simple logic circuit which is responsive to the switch setting and directs address pointer 36 to the portion of the ROM containing the coefficients of the selected phase shift. That is, phase selector 38 may be a simple decoder circuit.

In another embodiment, for example, where the coefficient subsets are each contained in separate recirculating shift registers (i.e., memory 32 comprises a plurality of such registers) phase selector 38 could take the typical form of a simple manual or electronic selector switch which connects multiplier 33 to the output terminal of the appropriate coefficient shift register. In any event, it will be realized that both memory unit 32 and phase selector 38 may be variously configured.

Once the desired phase shift is established by phase selector 38, address pointer 36 selects the coefficient within the coefficient subset which corresponds to the particular input signal sample transferred from shift register 31 to multiplier 33. Address pointer 36 of FIG. 2 is controlled by the output signal clock 42 of sequence control unit 41. During the normal calculation sequence, each clock pulse advances the address pointer by one unit, thereby supplying coefficient $g_p(k)$ to multiplier 33 while clock 42 simultaneously shifts input signal $x(n-k)$ from shift register 31 to the second input terminal of multiplier 33. Thus, it can be recognized that in the practice of this invention clock 42 generally produces Q output pulses during the sampling period of the applied signal $x_n$, so that calculations of a particular output sample will be completed when the next input signal sample arrives at input terminal 52. Q-count detector 43 receives clock pulses from clock 42 to control the operation of selector 37 and address pointer 36 and to reset accumulator 47 after the calculation of the coefficient for each output signal $y(n)$. Q-count detector 43 may be any conventional counter circuit and associated logic circuit which operate in a manner hereinafter described.

The operation of the phase shifter of FIG. 2 may be understood by considering the operating sequence for a single phase-shifted output point $y(n)$. At the beginning of the calculation sequence, storage register 49 contains the signal sample $x(n)$ and shift register 31 contains the previous signal samples $x(n-1)$, $x(n-2)$,...,$x(n-(Q-1))$. At the last clock pulse of the previous calculation sequence, Q-count detector 43 reached the count Q, resetting the circuit for the start of the new calculation sequence. This reset function consists of (1) clearing accumulator 47 by transferring the output of accumulator 47 to phase shifter output terminal 51; (2) opening recirculation path 35 of shift register 31 and connecting the shift register input to the output of storage register 49 by activation of selector 37; (3) setting address pointer 36 at the storage location of $g_p(Q-1)$ in memory unit 32; and (4) resetting Q-count detector 43 to an initial count of zero. With the circuit thus initialized, clock 42, activated by a system data ready signal at terminal 53 which signifies the arrival of signal $x(n)$, advances shift register 31, shifting data point $x(n-(Q-1))$ into multiplier 33 and signal sample $x(n)$ into the shift register location which previously held signal sample $x(n-1)$. Simultaneously, coefficient $g_p(Q-1)$ is transferred to the second input terminal of multiplier 33 and address pointer 36 is advanced to the location of $g_p(Q-2)$. Upon the transfer of signal samples $x(n)$ and $x(n-(Q-1))$, selector 37 is activated by Q-count detector 43, closing recirculate path 35 to place the shift register in a recirculating mode of operation. Selector 37 may be any conventional data selector-multiplexor circuit capable of handling the digital format employed. Shift register 31 remains in a recirculation mode during the remaining portion of the calculation sequence. Throughout the remaining portion of the calculation sequence, which consists of the next $Q$-1 counts of counter 42, signal samples $x(n-k)$, $k =$ $(Q-2), (Q-3),...,0)$ are sequentially shifted to multiplier 33 and recirculated within shift register 31. Simultaneously, with the transfer of a signal sample $x(n-k)$ the coefficient $g_p(k)$ is applied to the second input terminal of multiplier 33. Accumulator 47 is a conventional accumulator circuit which generally includes an adder circuit and a storage register. As is known in the art, each accumulator input signal is added to the quantity contained in the accumulator register. Thus the quantity contained in the accumulator register is, mathematically speaking, a summation of the input signals. Accordingly, accumulator 47 of FIG. 2 holds a summation of each of the products $x(n-k) g_p(k)$. When the system reaches the Qth multiplication coupling the product $x(n)g_p(0)$ to accumulator 47, the calculation of the output sample $y(n)$ is complete. At this time, shift register 31 contains the ordered sequence of signal samples $x(n)$, $x(n-1)$,...,$x(n-(Q-1))$, and the circuit is initialized as previously described, thus preparing the circuit to begin the calculation of output sample $y(n+1)$ when the next signal sample arrives at phase shift terminal 52 and the system data ready signal is applied to terminal 53.

What is claimed is:

1. A digital phase shifter providing a delay of $p/D$ T for an applied sampled signal $x(n)$, where T is the sampling period of $x(n)$ and $p$ and D are predetermined integers comprising:

means for storing said applied sampled signal $x(n)$ and $(Q-1)$ past samples $x(n-1)$, $x(n-2)$,... $x(n-(Q-1))$ of said applied signal $x(n)$ where Q is a preselected integer;

coefficient memory means for storing at least one subset of coefficients $g_p(k) = h'(kD + (-p) \oplus D)$ where $k = 0,1,2,...Q-1$ and $\oplus$ denotes modulo operation, said coefficients selected from a set of filter coefficients $h'(n)$ for an $N'$ order low pass filter where $N'=QD$;

means for multiplying signal sample $x(n-k)$ by coefficient $g_p(k)$ to form the product $x(n-k) g_p(k)$; and means for accumulating said products $x(n-k) g_p(k)$ over the range $k=0$ to $k=Q$-1.

2. The phase shifter of claim 1 wherein more than one set of coefficients $g_p(k)$ are stored within said memory means, said phase shifter further comprising means for selecting a particular set of said coefficients to thereby select the magnitude of said delay.

3. The phase shifter of claim 1 wherein said predetermined integer Q is equal to 2I+1, where I is a predetermined positive integer.

4. The phase shifter of claim 3 wherein said $h'(n)$ coefficients have the property that $h(i)=h(N-1-i)$ for $i=0, 1, 2,...ID$, and $h'(N)=h'(N+1) = ... h'(N'-1) = 0$, where $N = 2ID+1$ and $N' = (2I+1)D$.

5. A digital phase shifter for delaying an applied sampled signal by $p/D$ T, where T is the sampling period of said applied signal, D is a predetermined integer, and $p$ is a selectable integer between 0 and D-1 comprising:

means for storing Q samples of said applied sampled input signal in sequence $x(n)$, $x(n-1)$,...,$x(n-(Q-1))$;

memory means for storing D-1 subsets of coefficients $g_p(k) = h'(kD + (-p) \oplus D)$, where $k = 0, 1,...Q-1$ and $\oplus$ means modulo operation, said subsets selected from a set of filter coefficients $h'(n)$ for an $N'$ order low pass filter where $N' = QD$;

means for selecting a particular subset of said stored subsets of coefficients;

multiplication means responsive to the $k^{th}$ input sample, $x(n-k)$, and the $k^{th}$ coefficient for forming the product $x(n-k) g_p(k)$; and accumulator means for summing said products over the range $k=0$ to $k=Q-1$.

6. A digital phase shifter for delaying a sampled input signal by $p/D\ T$, where $T$ is the sampling interval of the applied signal and $p$ and $D$ are predetermined integers comprising:

means for storing an applied input signal sample $x(n)$;

shift register means for storing the preceding Q-1 input signal samples in the sequence $x(n-1)$, $x(n-2),...,x(n-(Q-1))$;

memory means for storing at least one subset of coefficients $g_p(k) = h'(kD + (-p \oplus D))$, where $k=0, 1,..., Q-1$, $Q$ is a predetermined integer and $\oplus$ denotes modulo operation said coefficients selected from a set of filter coefficients $h'(n)$ for an $N'$ order low pass filter where $N'=QD$;

multiplier means responsive to an applied signal sample, $x(n-k)$ and a single applied coefficient $g_p(k)$ of a set of said coefficients $g_p(k)$ to form the product signal $x(n-k) g_p(k)$;

means for addressing said memory means to transfer a particular one of said coefficients from said memory means to said multiplier means;

sequence control means for periodically advancing said shift register to supply input sample $x(n-k)$ to said multiplier, said sequence control means simultaneously controlling said address means to transfer the coefficient $g_p(k)$ to the second input terminal of said multiplier means, said sequence control means further including means for transferring said signal $x(n)$ to said shift register when said signal sample $x(n-(Q-1))$ is transferred to said multiplier and means for switching said shift register into a recirculating mode of operation during the transfer of all signal samples except the transfer of signal sample $x(n-(Q-1))$; and accumulator means responsive to said product signal of said multiplier means for accumulating said product output signal over the range $k=0$ to $k=Q-1$.

7. The digital phase shifter of claim 6 wherein said sequence control means includes a clock circuit for supplying Q periodic pulse signals during the sampling period of said input signal, said sequence control means further including means for detecting the completion of said Q periodic pulse signals to clear said accumulator by transferring said accumulated signal to the output terminal of said phase shifter.

8. The phase shifter of claim 7 wherein said predetermined integer Q is equal to (2I+1).

9. Apparatus responsive to an applied input signal sampled at a sampling period T, for shifting said applied input signal by $p/D\ T$ seconds where $p$ and $D$ are positive integers such that $p<D$ comprising:

means for interpolating said applied input signal by a factor equal to said integer D; to develop an interpolated signal that is effectively sampled at periods of T/D seconds;

means for attenuating signal frequency components which are centered about integer multiples of the 1/T sampling frequency of said applied input signal and for developing thereby a filtered signal, said signal frequency components being inherent in said applied input signal;

means for delaying said filtered signal by $p$ periods of the T/D sampling periods of said interpolated signal; and means for decimating by a preselected integer the output signal of said means for delaying.

10. The apparatus of claim 9 wherein said preselected integer is D.

11. A digital phase shifter for delaying an applied sampled signal by pT/D seconds, where T is the sampling interval of said applied signal and p and D are predetermined integers, said shifter employing a finite impulse response filter responsive to said applied signal characterized in that:

the order of said FIR filter is Q where Q=2I+1 and I is a preselected integer; and the coefficients, $g_p(k)$ $k=0,1,2,...Q-1$, of said filter are equal to $h(kD+(-p) \oplus D)$, where $\oplus$ denotes modulo operation each $h(i) = h(2ID-i)$ for $i=0,1,2,\ ...\ iD$ and $h(ID+1) = h(ID+2) = ...\ h(QD-1) = 0$.

* * * * *

UNITED STATES PATENT AND TRADEMARK OFFICE
CERTIFICATE OF CORRECTION

PATENT NO. : 3,997,772

DATED : December 14, 1976

INVENTOR(S) : Ronald E. Crochiere, Lawrence R. Rabiner and Richard R. Shively

It is certified that error appears in the above-identified patent and that said Letters Patent are hereby corrected as shown below:

Column 1, line 34, after "pages" delete the parenthesis and insert --692--; line 39, delete "x(n)," and insert --sampling--; after "decrease" delete "-1),...," and insert --by--.

Column 3, line 1, that portion of the formula reading "$W(e^{j\omega 1D})$" should read --$W(e^{j\omega/D})$--; line 6, that portion of the formula reading "$H(e^{j\omega 1D})e^{-j\omega p1D}$" should read --$H(e^{j\omega/D})e^{-j\omega p/D}$--; line 17, after "is" first occurrence, delete "/"; line 25, that portion of the formula reading "$e^{-j\omega p1D}$" should read --$e^{-j\omega p/D}$--; line 53 "hypotheticae" should read --hypothetical--; line 56, after "h(N+1)," delete --1),--; line 57, "hypotheticae" should read --hypothetical--.

Signed and Sealed this

Twenty-ninth Day of March 1977

[SEAL]

Attest:

RUTH C. MASON
*Attesting Officer*

C. MARSHALL DANN
*Commissioner of Patents and Trademarks*